US012711289B2

(12) United States Patent
Mariella et al.

(10) Patent No.: US 12,711,289 B2
(45) Date of Patent: Aug. 18, 2026

(54) OPTIMAL QUBIT ROUTING USING DOUBLE STOCHASTIC MATRICES

(71) Applicant: INTERNATIONAL BUSINESS MACHINES CORPORATION, Armonk, NY (US)

(72) Inventors: Nicola Mariella, Dublin (IE); Sergiy Zhuk, Dublin (IE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 570 days.

(21) Appl. No.: 18/446,456

(22) Filed: Aug. 8, 2023

(65) Prior Publication Data

US 2025/0053698 A1 Feb. 13, 2025

(51) Int. Cl.
*G06F 30/20* (2020.01)
*G06N 10/40* (2022.01)

(52) U.S. Cl.
CPC ............. *G06F 30/20* (2020.01); *G06N 10/40* (2022.01)

(58) Field of Classification Search
CPC ................................ G06F 30/20; G06N 10/40
See application file for complete search history.

(56) References Cited

U.S. PATENT DOCUMENTS 11,765,041 B1 * 9/2023 Sobhani .................. H04L 41/12 709/220
2006/0123363 A1 * 6/2006 Williams ............... G06N 10/20 977/839
2019/0369619 A1 * 12/2019 Carioni ................. B60W 50/14
2020/0218842 A1 7/2020 Itoko
2020/0394544 A1 12/2020 Low
2021/0279631 A1 9/2021 Pichler
2021/0374583 A1 12/2021 Griffin
2024/0289674 A1 * 8/2024 Teixeira de Abreu Pinho ............ G06N 10/80
2024/0354612 A1 * 10/2024 Healy .................... G06N 10/20

OTHER PUBLICATIONS

Santucci et al., "Doubly Stochastic Matrix Models for Estimation of Distribution Algorithms," Apr. 2023, arXiv:2304.02458v1 (Year: 2023).*

Wagner et al., "Improving Quantum Computation by Optimized Qubit Routing," 2023, arXiv:2206.01294v3 (Year: 2023).*

Nannicini, G. et al., "Optimal Qubit Assignment and Routing via Integer Programming", arXiv:2106.06446v3 [quant-ph] (2021), 29 pgs.

(Continued)

*Primary Examiner* — Michael J Huntley
*Assistant Examiner* — Vincent Anton Spraul
(74) *Attorney, Agent, or Firm* — Amin, Turocy & Watson, LLP

(57) ABSTRACT

A method for building a quantum computing circuit optimizes qubit routing in the circuit. A computer processor receives a plurality of qubits and an initial input circuit layer. Layers of quantum sub-circuits are extracted from the initial input circuit layer. Adjacency matrices are built for the layers of quantum sub-circuits. A cost function is determined for the extracted layers, based on the number of constraints violations determined by the doubly stochastic matrices. In addition, a final quantum circuit topology is selected based on the cost function of the extracted layers.

20 Claims, 10 Drawing Sheets

(56) References Cited

OTHER PUBLICATIONS

Li, G. et al. “Tackling the Qubit Mapping Problem for NISQ-Era Quantum Devices”, arXiv:1809.02573v2 (2019), 13 pgs.
Mariella et al., “A doubly stochastic matrices-based approach to optimal qubit routing”, Oct. 6, 2022, 30 pages.
No Author “qiskit-community / dsm-swap”, Github, Apr. 20, 2026, 03 pages, https://github.com/qiskit-community/dsm-swap.

* cited by examiner

OPTIMAL QUBIT ROUTING USING DOUBLE STOCHASTIC MATRICES

BACKGROUND

Technical Field

The present disclosure generally relates to quantum computing, and more particularly, to optimal qubit routing using double stochastic matrices.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

In the quantum computing field, the qubit routing procedure is a fundamental component of the quantum compiler. Its role is that of mapping logical qubits to physical ones while preserving the resulting unitary (up to a permutation) and fulfilling the connectivity constraints of the target hardware. The constraints include the set of pairs of physical qubits upon which a two-qubit gate can be applied.

The routing is obtained by introducing SWAP gates, which determine a permutation of the mapping between logical and physical qubits. The permutations are calculated so that the multi-qubit gates of the compiled circuit do not violate the connectivity restrictions of the hardware.

SUMMARY

According to an embodiment of the present disclosure, a computer program product for building a quantum circuit includes one or more computer readable storage media, and program instructions collectively stored on the one or more computer readable storage media. The program instructions include receiving, by a computer processor, a plurality of qubits and an initial input circuit layer including one or more of the plurality of qubits. Layers of quantum sub-circuits are extracted from the initial input circuit layer. Adjacency matrices are built for the layers of quantum sub-circuits. A cost function is determined for the extracted layers, based on the number of constraints violations determined by the doubly stochastic matrices. A final quantum circuit topology is selected based on the cost function of the extracted layers. In addition, the quantum circuit is performed using the final circuit topology, on a quantum computer.

According to an embodiment of the present disclosure, a method for building a quantum circuit includes receiving, by a computer processor, a plurality of qubits and an initial input circuit layer including one or more of the plurality of qubits. Layers of quantum sub-circuits are extracted from the initial input circuit layer. Adjacency matrices are built for the layers of quantum sub-circuits. A cost function is determined for the extracted layers, based on the number of constraints violations determined by the doubly stochastic matrices. A final quantum circuit topology is selected based on the cost function of the extracted layers. In addition, the quantum circuit is performed using the final circuit topology, on a quantum computer.

According to an embodiment of the present disclosure, a computing device for building a quantum circuit includes a computer processor operating a qubit routing engine and a memory coupled to the computer processor. The memory stores instructions to cause the computer processor to perform acts including receiving, by the computer processor, a plurality of qubits and an initial input circuit layer including one or more of the plurality of qubits. Layers of quantum sub-circuits are extracted from the initial input circuit layer. Adjacency matrices are built for the layers of quantum sub-circuits. A cost function is determined for the extracted layers, based on the number of constraints violations determined by the doubly stochastic matrices. A final quantum circuit topology is selected based on the cost function of the extracted layers. In addition, the quantum circuit is performed using the final circuit topology, on a quantum computer The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Figure 1:
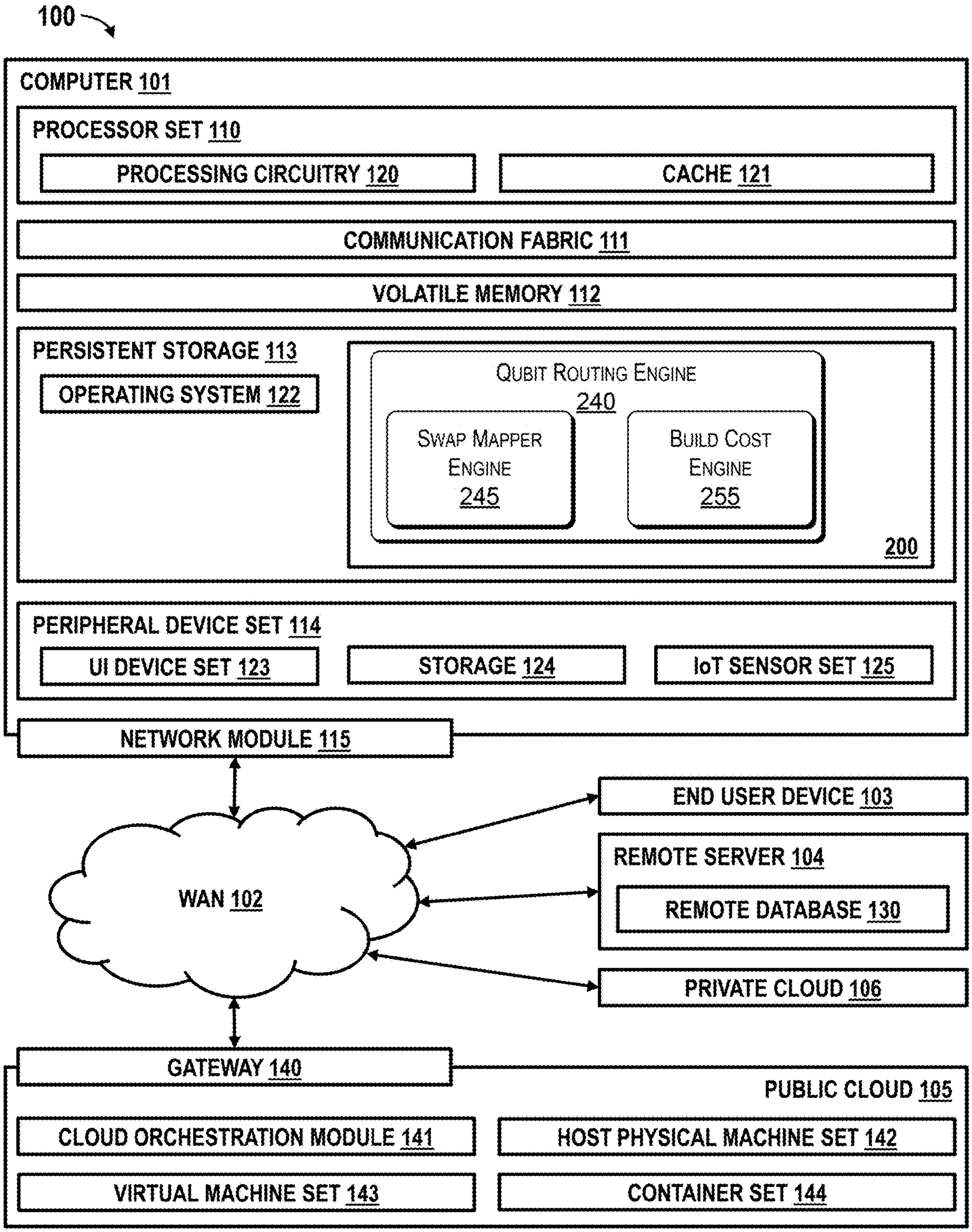
FIG. 1 is a block diagram of a computing environment for quantum computing according to an embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Definitions

Qubit routing, as used herein, refers to the task of modifying quantum circuits so that they satisfy the connectivity constraints of a target quantum computer. This involves inserting SWAP gates into the circuit so that the logical gates only ever occur between adjacent physical qubits.

Quantum logic gate (or simply quantum gate), as used herein, refers to a basic quantum circuit operating on qubits.

Qubit, as used herein, refers to a basic unit of quantum information using the classic binary bit physically realized with a two-state device.

Swap Gate, as used herein, refers to two-qubit operation. Expressed in basis states, the SWAP gate swaps the state of the two qubits involved in the operation.

CNOT, as used herein, refers to a controlled NOT gate, which is a type of quantum logic gate.

Swap Mapper, as used herein, refers to a software engine that places instances of swap gates in a proposed qubit circuit.

Overview

The present disclosure generally relates to quantum circuits, e.g., quantum circuit design. Quantum computing uses quantum physics to encode and process information rather than binary digital techniques based on transistors. A quantum computing device employs quantum bits (sometimes referred to as qubits) that operate according to the laws of quantum physics and can exhibit phenomena such as superposition and entanglement. The superposition principle of quantum physics allows qubits to be in a state that partially represent both a value of "1" and a value of "O" at the same time. The entanglement principle of quantum physics allows qubits to be correlated with each other such that the combined states of the qubits cannot be factored into individual qubit states. For instance, a state of a first qubit can depend on a state of a second qubit. As such, a quantum circuit can employ qubits to encode and process information in a manner that can be significantly different from binary digital techniques based on transistors. However, the designing of quantum circuits often can be relatively difficult and/or time consuming.

A universal quantum computing circuit design can be utilized for an algorithm to create a superconducting quantum computing circuit to perform superconducting quantum circuit operations. A universal quantum computing circuit typically can have qubits that can be connected to their neighbor qubits, and typically can run (e.g., virtually all) types of algorithms, although with varying and/or limited levels of performance, due at least in part to, for example, resource limits and design constraints, as well as the universal nature of the connectivity of the qubits in the universal quantum computing circuit. With regard to universal quantum computing circuits, for operations on qubits that have no direct connection, multiple swap gates typically can be used. However, there can be a number of challenges with using universal quantum computing circuits for algorithms, particularly with regard to using universal quantum computing circuits on non-ideal quantum processors. Certain quantum processors can be considered non-ideal, for example, because they can comprise non-ideal qubits (e.g., short coherence times) and/or non-ideal gates (e.g., gate errors). Due to these and/or other non-idealities, there can be a limit on the number of gate operations that can be employed while still obtaining reasonable fidelity of the final outcome. These types of circuits are often referred to as shallow. Universal quantum computing circuits can have a general connectivity onto which various algorithms can be implemented. However, there can be an undesirable and/or unduly higher accumulative error rate when using a universal quantum computing circuit for an algorithm, due in part to the relatively higher number of gate operations used, as gate fidelity is not 100%. These and other deficiencies of conventional quantum computing circuit designs, such as universal quantum computing circuits, can result in inefficient and/or ineffective circuits and/or inefficient performance of a quantum circuit design.

In qubit routing, where instances of swap gates occur in a qubit circuit impacts the efficiency of a quantum computing circuit. Swap gates in some positions along the circuit contribute to depth in the circuit. Excessive circuit depth can lead to undesirable long processing times. The swap mapping problem is commonly addressed using rule-based heuristics or integer programming. Typical examples are the SABRE algorithm and the binary integer programming (BIP) formulation. Solvers based on mathematical optimization are in general very slow. Heuristic approaches alone may produce low quality solutions. The use of SABRE may degrade performance when there is increasing gates parallelization (layers of commuting 2-qubit gates).

In the present disclosure, a swap mapping process based on mathematical optimization and doubly stochastic matrices (DSM) is provided. Doubly stochastic matrices are convex combinations of permutations matrices. Since the qubit allocation makes use of swaps (permutations), the decision process may be modeled using a superposition of swap and identity matrices. Such superposition may then be tuned by means of continuous parameters controlled by an optimizer module. In addition, powerful algebraic properties of the resulting cost function allow the modeling of swap count and depth minimization. On the optimizer side, a solver that scales linearly with the depth of the circuit may be included. It should be appreciated that for compiling quantum-volume circuits on 8 qubits, the solver of the present disclosure outperforms the state-of-the-art algorithm SABRE in terms of depth of the resulting circuit by 20 percentage points.

Embodiments of the subject disclosure may use doubly stochastic matrices in a swap mapper when determining the instances of a gate swap in a qubit circuit. The double stochastic matrices may intuitively represent the superposition of possible solutions. Considering reference circuits, the solver time of an associated qubit circuit is sped up to the order of minutes instead of tens of minutes or worse hours when compared to for example, the BIP approach.

Importantly, although the operational/functional descriptions described herein may be understandable by the human mind, they are not abstract ideas of the operations/functions divorced from computational implementation of those operations/functions. Rather, the operations/functions represent a specification for an appropriately configured computing device. As discussed in detail below, the operational/functional language is to be read in its proper technological context, i.e., as concrete specifications for physical implementations.

It should be appreciated that aspects of the teachings herein are beyond the capability of a human mind. It should also be appreciated that the various embodiments of the subject disclosure described herein can include information that is impossible to obtain manually by an entity, such as a human user. For example, the type, amount, and/or variety of information included in performing the process discussed herein can be more complex than information that could be reasonably be processed manually by a human user.

Example Computing Environment

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as For example, some embodiments include a qubit routing engine 240 that determines optimal qubit routing circuits using double stochastic matrices in a problem solver. In some embodiments, the qubit routing engine 240 may include a swap mapper engine 245 that determines the optimal placement of swap gates in a qubit routing circuit. In some embodiments, the qubit routing engine 240 may include a build cost engine 255 that calculates the costs associated with time and/or power of a circuit being analyzed. The qubit routing engine 240, swap mapper engine 245, and build cost engine 255 may operate according to one or more of the methods disclosed in further detail below. In addition to qubit routing engine 240, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2A:
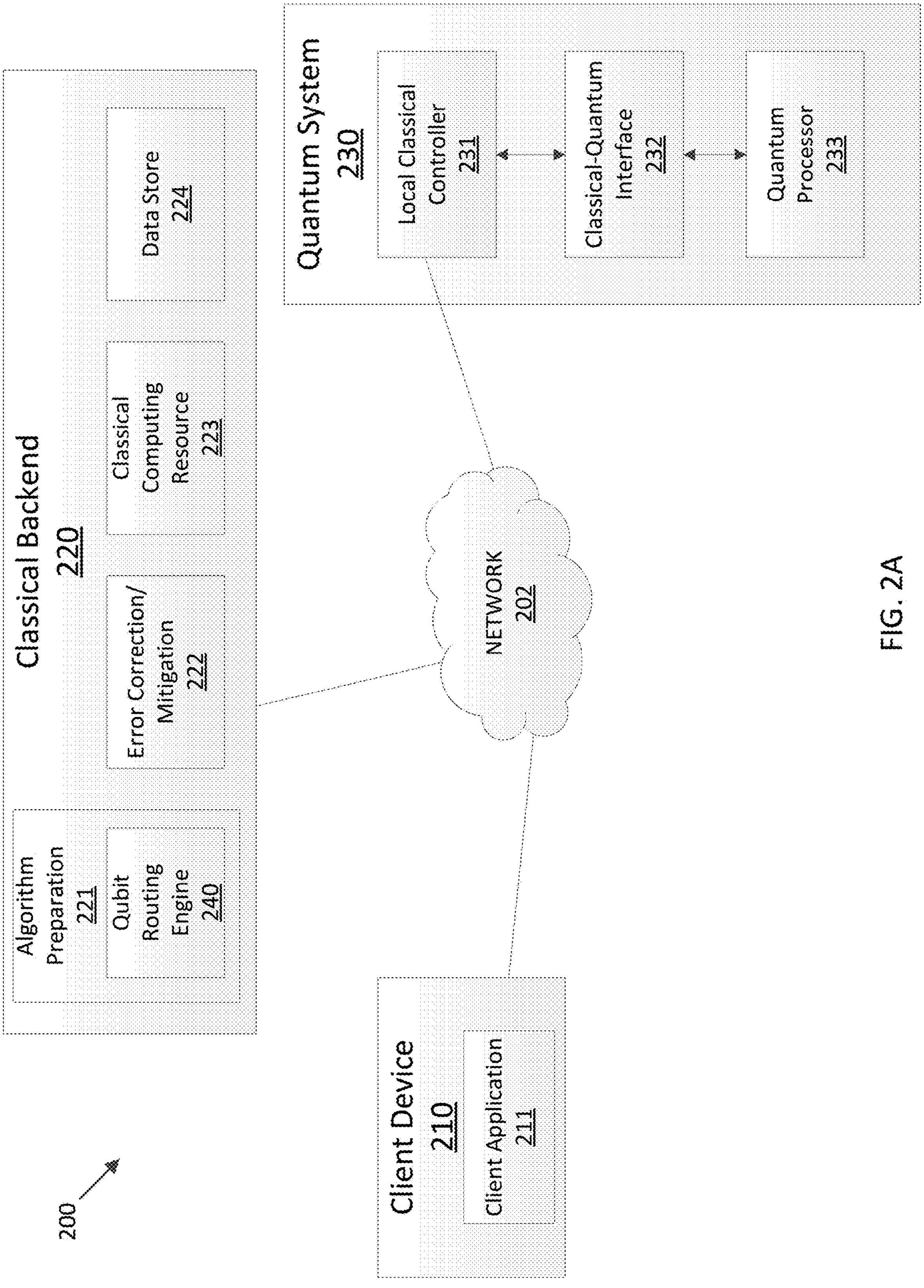
FIG. 2A is a block diagram of a hybrid computing system according to an embodiment.

FIG. 2A illustrates a block diagram of an example hybrid computing system 200 that can facilitate execution of a quantum algorithm. As shown, a client device 210 may interface with a classical backend 220 to enable computations with the aid of a quantum system 230.

Network 202 may be any combination of connections and protocols that will support communications between the client device 210, the classical backend 220, and the quantum system 230. In an example embodiment, network 202 may WAN 102.

Client device 210 may be an implementation of computer 101 or EUD 103, described in more detail with reference to FIG. 1, configured to operate in a hybrid computing system 200.

Client application 211 may include an application or program code that includes computations requiring a quantum algorithm or quantum operation. In an embodiment, client application 211 may include an object-oriented programming language, such as Python® ("Python" is a registered trademark of the Python Software Foundation), capable of using programming libraries or modules containing quantum computing commands or algorithms, such as QISKIT ("QISKIT" is a registered trademark of the International Business Machines Corporation). In another embodiment, client application 211 may include machine level instructions for performing a quantum circuit, such as OpenQASM. Additionally, a user application may be any other high-level interface, such as a graphical user interface, having the underlying object oriented and/or machine level code as described above.

The classical backend 220 may be an implementation of computer 101, described in more detail with reference to FIG. 1, having program modules configured to operate in a hybrid computing system 200. Such program modules for classical backend 220 may include algorithm preparation 221, classical computation 223, and data store 224.

Algorithm preparation 221 may be a program or module capable of preparing algorithms contained in client application 211 for operation on quantum system 230. Algorithm preparation 221 may be instantiated as part of a larger algorithm, such as a function call of an API, or by parsing a hybrid classical-quantum computation into aspects for quantum and classical calculation. Algorithm preparation 221 may additionally compile or transpile quantum circuits that were contained in client application 211 into an assembly language code for use by the local classical controller 231 to enable the quantum processor 233 to perform the logical operations of the circuit on physical structures. During transpilation/compilation an executable quantum circuit in the quantum assembly language may be created based on the calculations to be performed, the data to be analyzed, and the available quantum hardware. In one example embodiment, algorithm preparation 221 may select a quantum circuit from a library of circuits that have been designed for use in a particular problem. In another example embodiment, algorithm preparation 221 may receive a quantum circuit from the client application 211 and may perform transformations on the quantum circuit to make the circuit more efficient, or to fit the quantum circuit to available architecture of the quantum processor 233. Additionally, algorithm preparation 221 may prepare classical data from data store 224, or client application 211, as part of the assembly language code for implementing the quantum circuit by the local classical controller 231. Algorithm preparation 221 may additionally set the number of shots (i.e., one complete execution of a quantum circuit) for each circuit to achieve a robust result of the operation of the algorithm. Further, algorithm preparation 221 may update, or re-compile/re-transpile, the assembly language code based on parallel operations occurring in classical computing resource 223 or results received during execution of the quantum calculation on quantum system 230. Additionally, algorithm preparation 221 may determine the criterion for convergence of the quantum algorithm or hybrid algorithm. Algorithm Preparation 221 may include the qubit routing engine 240, using the associated swap mapper engine 245 and build cost engine 255, which are explained in more detail below.

Error Suppression/Mitigation 222 may be a program or module capable of performing error suppression or mitigation techniques for improving the reliability of results of quantum computations. Error suppression is the most basic level of error handling. Error suppression refers to techniques where knowledge about the undesirable effects of quantum hardware is used to introduce customization that can anticipate and avoid the potential impacts of those effects, such as modifying signals from Classical-quantum interface 232 based on the undesirable effects. Error mitigation uses the outputs of ensembles of circuits to reduce or eliminate the effect of noise in estimating expectation values. Error mitigation may include techniques such as Zero Noise Extrapolation (ZNE) and Probabilistic Error Correction (PEC).

Classical computing resource 223 may be a program or module capable of performing classical (e.g., binary, digital) calculations contained in client application 211. Classical calculations may include formal logical decisions, AI/ML algorithms, floating point operations, and/or simulation of Quantum operations.

Data store 224 may be a repository for data to be analyzed using a quantum computing algorithm, as well as the results of such analysis. Data store 224 may be an implementation of storage 124 and/or remote database 130, described in more detail with reference to FIG. 1, configured to operate in a hybrid computing system 200.

The quantum system 230 can be any suitable set of components capable of performing quantum operations on a physical system. In the example embodiment depicted in FIG. 2A, quantum system 230 includes a local classical controller 231, a classical-quantum interface 232, and quantum processor 233. In some embodiments, all or part of each of the local classical controller 231, a classical-quantum interface 232, and quantum processor 233 may be located in a cryogenic environment to aid in the performance of the quantum operations. In an embodiment, classical backend 220 and quantum system 230 may be co-located to reduce the communication latency between the devices.

Local classical controller 231 may be any combination of classical computing components capable of aiding a quantum computation, such as executing a one or more quantum operations to form a quantum circuit, by providing commands to a classical-quantum interface 232 as to the type and order of signals to provide to the quantum processor 233. Local classical controller 231 may additionally perform other low/no latency functions, such as error correction, to enable efficient quantum computations. Such digital computing devices may include processors and memory for storing and executing quantum commands using classical-quantum interface 232. Additionally, such digital computing devices may include devices having communication protocols for receiving such commands and sending results of the performed quantum computations to classical backend 220. Additionally, the digital computing devices may include communications interfaces with the classical-quantum interface 232. In an embodiment, local classical controller 231 may include all components of computer 101, or alternatively may be individual components configured for specific quantum computing functionality, such as processor set 110, communication fabric 111, volatile memory 112, persistent storage 113, and network module 115.

Classical-quantum interface 232 may be any combination of devices capable of receiving command signals from local classical controller 231 and converting those signals into a format for performing quantum operations on the quantum processor 233. Such signals may include electrical (e.g., RF, microwave, DC) or optical signals to perform one or more single qubit operations (e.g., Pauli gate, Hadamard gate, Phase gate, Identity gate), signals to preform multi-qubit operations (e.g., CNOT-gate, CZ-gate, SWAP gate, Toffoli gate), qubit state readout signals, and any other signals that might enable quantum calculations, quantum error correction, and initiate the readout of a state of a qubit. Additionally, classical-quantum interface 232 may be capable of converting signals received from the quantum processor 233 into digital signals capable of processing and transmitting by local classical controller 231 and classical backend 220. Such signals may include qubit state readouts. Devices included in classical-quantum interface 232 may include, but are not limited to, digital-to-analog converters, analog-to-digital converters, waveform generators, attenuators, amplifiers, filters, optical fibers, and lasers.

Quantum processor 233 may be any hardware capable of using quantum states to process information. Such hardware may include a collection of qubits, mechanisms to couple/entangle the qubits, and any required signal routings to communicate between qubits or with classical-quantum interface 232 in order to process information using the quantum states. Such qubits may include, but are not limited to, charge qubits, flux qubits, phase qubits, spin qubits, and trapped ion qubits. The architecture of quantum processor 233, such as the arrangement of data qubits, error correcting qubits, and the couplings amongst them, may be a consideration in performing a quantum circuit on quantum processor 233.

Figure 2B:
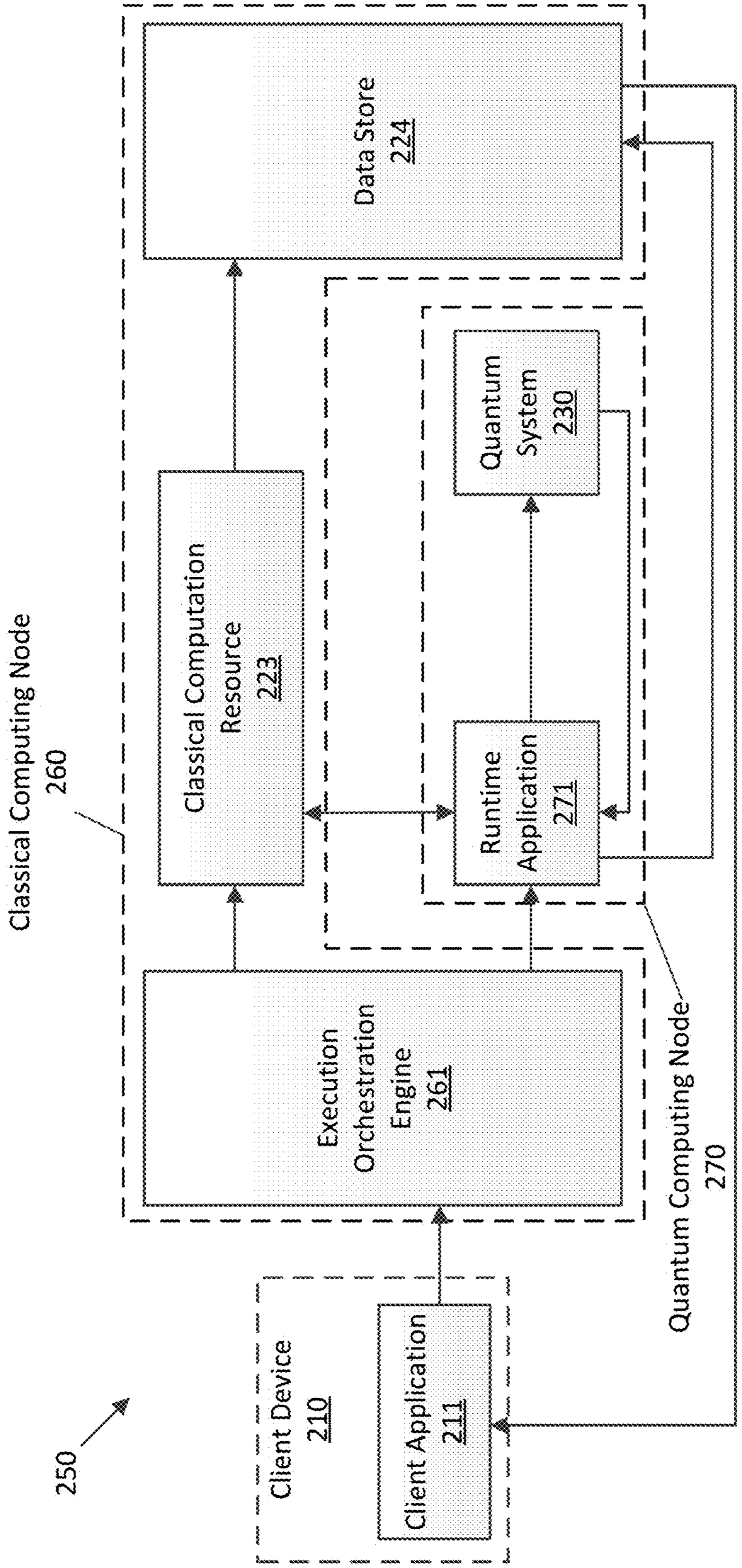
FIG. 2B is a block diagram of an architecture, and data transmission, of hybrid computing system of FIG. 2A, consistent with embodiments.

Referring now to FIG. 2B, a block diagram is depicted showing an example architecture, and data transmission, of hybrid computation system 250 employed using a cloud architecture for classical backend 220. Hybrid computation system 250 receives an algorithm containing a computation from a client application 211 of client device 210. Upon receipt of the algorithm and request from client application 211, hybrid computation system 250 instantiates a classical computing node 260 and a quantum computing node 270 to manage the parallel computations. The classical computing node 260 may include one or more classical computers capable of working in tandem (e.g., utilizing the cloud computing environment described with reference to FIGS. Y and Y+1). For example, classical computing node 260 may include an execution orchestration engine 261, one or more classical computation resources 223, and a result data store 224. The backend quantum runtime system 202 may include a combination of classical and quantum computing components acting together to perform quantum calculations on quantum hardware including, for example, one or more quantum systems 230. The quantum computing node 270 may include a quantum runtime application 271 and one or more quantum systems 230.

The client application 211 may include programing instructions to perform quantum and classical calculations. In an embodiment, client application 211 may be in a general purpose computing language, such as an object oriented computing language (e.g., Python®), that may include classical and quantum functions and function calls. This may enable developers to operate in environments they are comfortable with, thereby enabling a lower barrier of adoption for quantum computation.

The execution orchestration engine 261, in using algorithm preparation 221, may parse the client application 211 into a quantum logic/operations portion for implementation on a quantum computing node 270, and a classical logic/operations portion for implementation on a classical node 260 using a classical computation resource 223. In an embodiment, parsing the client application 211 may include performing one or more data processing steps prior to operating the quantum logic using the processed data. In an embodiment, parsing the client application 211 may including segmenting a quantum circuit into portions that are capable of being processed by quantum computing node 270, in which the partial results of each of the segmented quantum circuits may be recombined as a result to the quantum circuit. Execution orchestration engine 261 may parse the hybrid algorithm such that a portion of the algorithm is performed using classical computation resources 223 and a session of quantum computing node 270 may open to perform a portion of the algorithm. Quantum runtime application 271 may communicate, directly or indirectly, with classical computation resources 223 by sending parameters/information between the session to perform parallel calculations and generate/update instructions of quantum assembly language to operate quantum system 230, and receiving parameters/information/results from the session on the quantum system 230. Following the parsing of the hybrid algorithm for calculation on quantum computing node 270 and classical computing node 260, the parallel nodes may iterate the session to convergence by passing the results of quantum circuits, or partial quantum circuits, performed on quantum system 230 to classical computing resource 223 for further calculations. Additionally, runtime application 271, using algorithm preparation 221, may re-parse aspects of the hybrid algorithm to improve convergence or accuracy of the result. Such operation results, and progress of convergence, may be sent back to client device 210 as the operations are being performed. By operating execution orchestration engine 261 in a cloud environment, the environment may scale (e.g., use additional computers to perform operations necessary) as required by the client application 211 without any input from the creators/implementors of client application 211. Additionally, execution orchestration engine 261, while parsing the client application 211 into classical and quantum operations, may generate parameters, function calls, or other mechanisms in which classical computation resource 223 and quantum computing node 270 may pass information (e.g., data, commands) between the components such that the performance of the computations enabled by client application 211 is efficient.

Classical computation resources 223 may perform classical computations (e.g., formal logical decisions, AI/ML algorithms, floating point operations, simulation of Quantum operations) that aid/enable/parallelize the computations instructed by client application 211. By utilizing classical computation resources 223 in an adaptively scalable environment, such as a cloud environment, the environment may scale (e.g., use additional computers to perform operations necessary including adding more classical computation resources 223, additional quantum systems 230, and/or additional resources of quantum systems 230 within a given quantum computing node 270) as required by the client application 211 without any input from the creators/implementors/developers of client application 211, and may appear seamless to any individual implementing client application 211 as there are no required programming instructions in client application 211 needed to adapt to the classical computation resources 223. Thus, for example, such scaling of quantum computing resources and classical computing resources may be provided as needed without user intervention. Scaling may reduce the idle time, and thus reduce capacity and management of computers in classical computing node 260.

Result data store 224 may store, and return to client device 210, states, configuration data, etc., as well as the results of the computations of the client application 211.

Implementation of the systems described herein may enable hybrid computing system 200, through the use of quantum system 230, to process information, or solve problems, in a manner not previously capable. The efficient parsing of the quantum or hybrid algorithm into classical and quantum segments for calculation may achieve efficient and accurate quantum calculations from the quantum system 230 for problems that are exponentially difficult to perform using classical backend 220. Additionally, the quantum assembly language created by classical backend 220 may enable quantum system 230 to use quantum states to perform calculations that are not classically efficient or accurate. Specifically, the calculations analyze the different gate swapping permutations possible at different stages of a qubit circuit topology by using doubly stochastic matrices in the calculations. The use of doubly stochastic matrices determines qubit routes with an improved efficiency; for example, by reducing the number of gates needed which reduces the overall circuit depth. In addition, by eliminating the number of gates used in the quantum circuit, the error rate for the quantum circuit becomes reduced. Such improvement may reduce the classical resources required to perform the calculation of the quantum or hybrid algorithm, by improving the capabilities of the quantum system 230.

Example Quantum Circuit Elements

Figure 3:
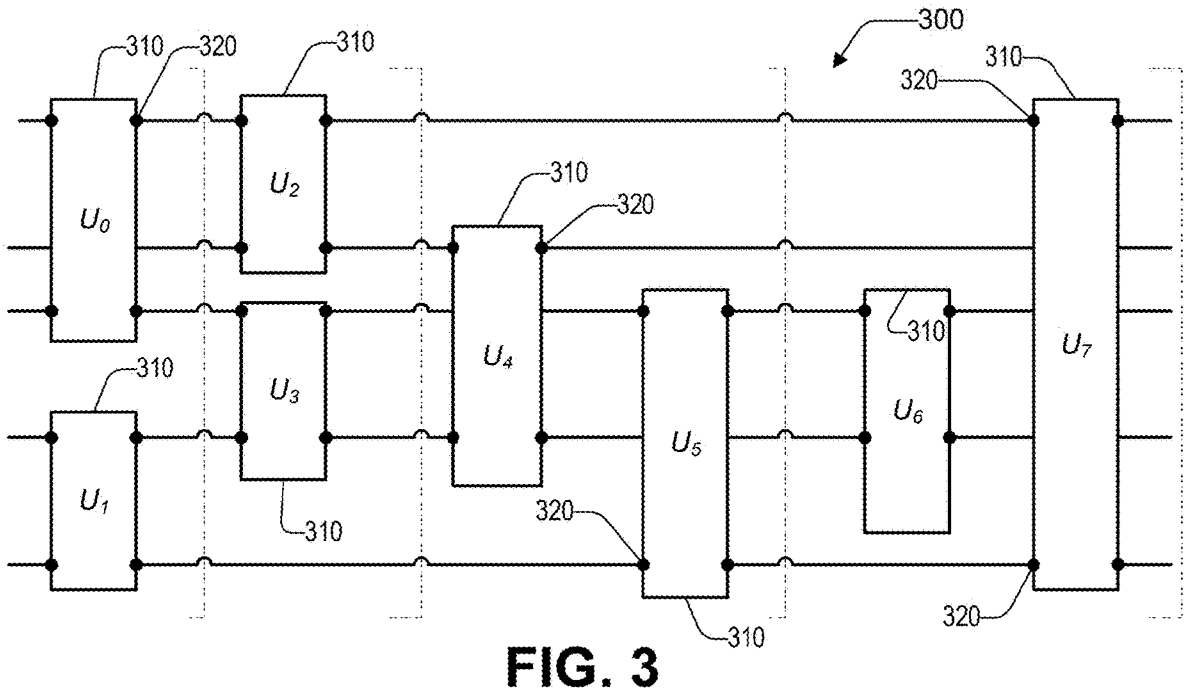
FIG. 3 is a diagrammatic view of an example quantum circuit, consistent with embodiments of the subject disclosure.

To provide a general context for implementation of the subject technology to a quantum computing environment, reference now is made to FIG. 3, which shows an example quantum circuit 300. The quantum circuit 300 illustrates commutative layering for a circuit of 2-qubit blocks 310. The blocks 310 represent generic U(4) unitaries. The dots 320 identify the qubits in the circuit 300 upon which each unitary acts. The vertical dashed lines determine the layering, so that, for example, taking $U_0$ and $U_1$ from the first circuit layer, then $(U_0 \otimes I^{\otimes 2})(I^{\otimes 2} \otimes U_1)=(I^{\otimes 2}\otimes U_1)(U_0\otimes I^{\otimes 2})$, that is $U_0$, $U_1$ commute. In the methods described below, a quantum circuit will be decomposed into layers of commuting two-qubit gates. The circuit layers may be analyzed as sub-circuits of the overall quantum circuit being built to determine build cost for different permutations of swap gates being implemented into the quantum circuit.

Figure 4B:
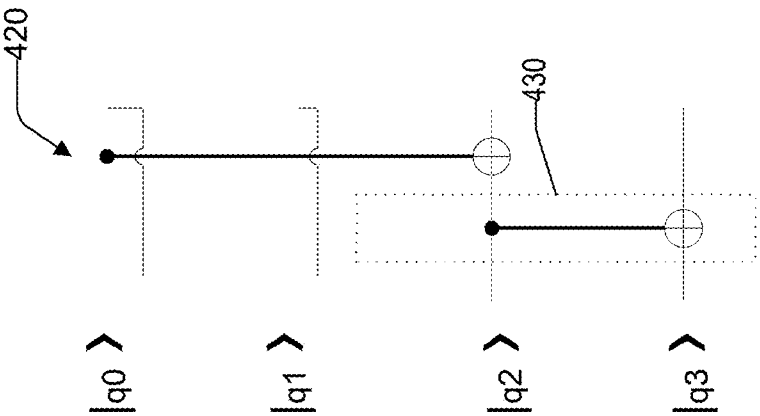
FIGS. 4A, 4B, 4C, and 4D are a diagrammatic view of a qubit routing permutation consistent with embodiments of the subject disclosure.
Figure 4A:
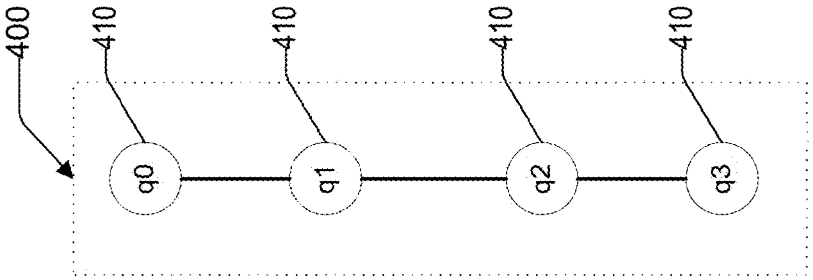
Figure 4D:
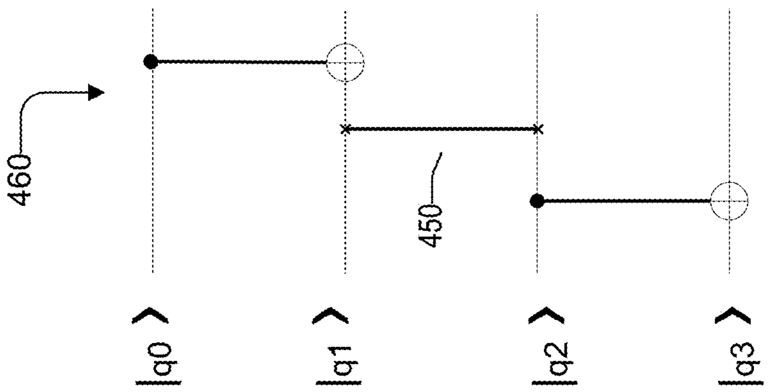
Figure 4C:
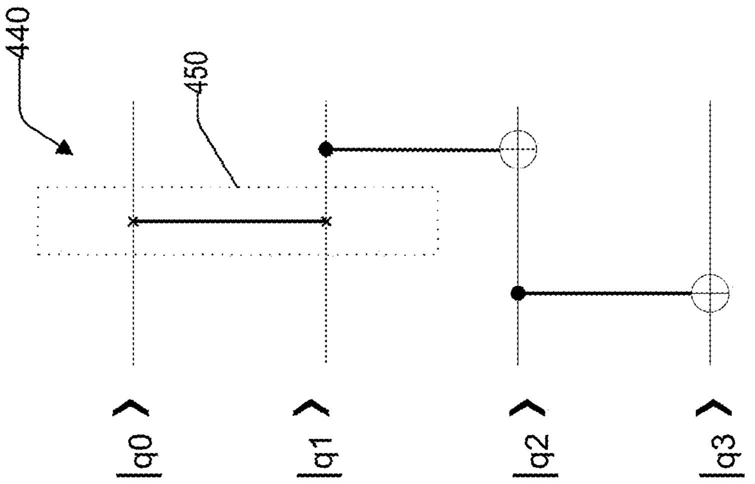

FIGS. 4A-4D illustrate different aspects of a circuit 400 to be routed on a target topology (with given initial layout) and two possible solutions. More specifically, FIG. 4A shows an example of a 4-qubit topology 400 of qubits 410. FIG. 4B shows an example of an initial input circuit layer 420. The input circuit layer 420 includes a plurality of (in this instance, two) CNOT gates 430. One of the CNOT gates 430 is outlined by a dotted line to show the control bit and target bit elements. FIGS. 4C and 4D represent two potential different routing circuits 440 and 460 that may be constructed from the initial input circuit layer 420. In each routing circuit 440 and 460, a swap gate 450 is included. The routing circuits 440 and 460 both involve two "actions" under the former action formulation, and therefore appear equivalent, since they both schedule two gates. However, in reality, routing circuit 440 can occur in two timesteps, since the first CNOT and the SWAP can occur in parallel, while routing circuit 460 take three timesteps. In this example, the routing circuit 440 is the more optimal solution, because it reduces (e.g., minimizes) added circuit depth. In the methodology discussed further below, the qubit routing engine 240 will use double stochastic matrices to represent the different possible circuit layers. The use of double stochastic matrices will help identify the optimal instances of swap operations in the quantum circuit so that circuit depth is minimized.

Example Formulation of Optimization Problem: Constraint Specification for Different Topologies Embodiments may generally include a hardware cost function L. In the construction of the hardware function L, the sequence of PSSWAPs depends on some hyper-parameters. The structure of the PSSWAPs may be determined for the case of the line connectivity between qubits. The line connectivity model may be defined as a chain of m qubits (assuming m≥3) where the neighborhoods of qubit k∈[1 . . . m−2] are qubits k−1 and k+1. The extremes of the chain, that is qubits 0 and m−1, have neighborhood, respectively, qubit 1 and qubit m−2.

Assuming for simplicity that the number of qubits m for a circuit is an odd integer greater than two, then the set of generating swaps $P_M$, contains m−1 elements. T h e set $P_M$ is partitioned into the following subsets:

$$\Gamma_1 = \{SWAP(2\underline{k}, 2k+1) \mid k \in [0 \ldots (m-1)/2]\}, \quad (1)$$

$$\Gamma_2 = \{SWAP(2k+1, 2k+2) \mid k \in [0 \ldots (m-1)/2]\}, \quad (2)$$

Accordingly, $P_M=\Gamma_1\cup\Gamma_2$. For any $Q_1$, $Q_2\in\Gamma_1$, then $Q_1Q_2=Q_2Q_1$, and similarly the same also holds for $\Gamma_2$.

The next lemma extends the commutativity from the generating permutations to the generated DSM. The result is immediate, so the claim is stated without proof.

Let $P_1$, $P_2$ be m×m permutation matrices such that $P_1P_2=P_2P_1$, that is the permutations commute. Then the following doubly stochastic matrices also commute:

$$Qk = (1-\alpha_k)I_m + \alpha_k P_k, \quad (3)$$

where $\alpha_k\in[0, 1]$, for k=1, 2. That is, $Q_1Q_2=Q_2Q_1$.

Consequently, the product of doubly stochastic matrices obtained from either $\Gamma_1$ or $\Gamma_2$ commute. The composition of such commuting matrices (PSSWAPs) is controlled by the continuous parameters θ, so $$C(\Gamma_k, \theta) = \prod_{P_i\in\Gamma_k} \left(\mathbb{I}_m^{\otimes 2} + \sin^2(\theta_i)\left(P_i^{\otimes 2} - \mathbb{I}_m^{\otimes 2}\right)\right) \quad (4)$$

To complete the construction, the definition of $P^{(t)}$ related to the hardware cost function is used with a finite sequence of alternating structures of the form $C(\Gamma_k, \theta)$, that is:

$$P(t) = C\left(\Gamma_1, \theta_1^{(t)}\right)\cdot C\left(\Gamma_2, \theta_2^{(t)}\right)\cdot C\left(\Gamma_3, \theta_3^{(t)}\right)\cdot C\left(\Gamma_4, \theta_4^{(t)}\right)\ldots \quad (5)$$

Figure 4E:
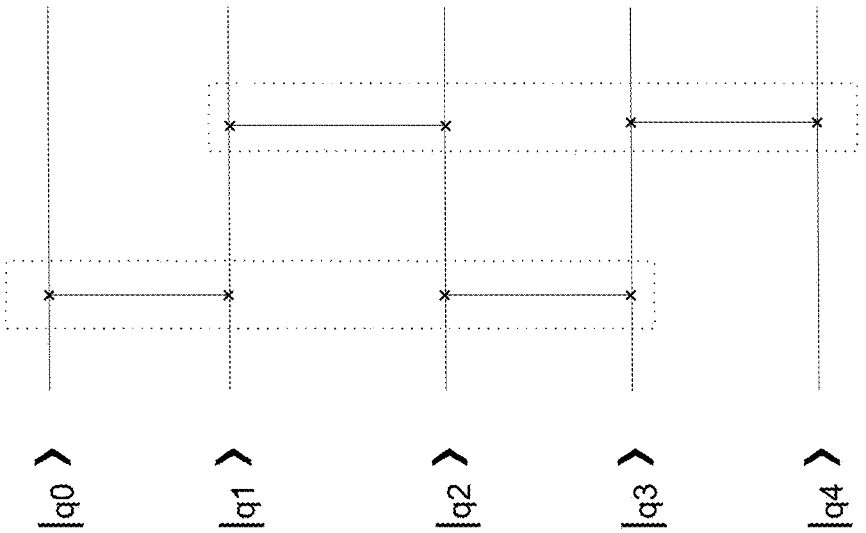
FIG. 4E is a diagrammatic view of a pattern of qubit swaps, consistent with embodiments of the subject disclosure.

FIG. 4E shows an example of the pattern of swaps for the line connectivity with m=5 qubits. The dashed frames represent respectively the set $\Gamma_1$ and $\Gamma_2$.

The next lemma shows one of the motivations that justify this construction, that is efficient matrix multiplication for permutations within the same partition.

Let a, b∈$S_m$ be distinct, involutory and commuting elements of the symmetric group of degree m, that is a≠b, $a^2=b^2=e$ and a·b=b·a, where e∈$S_m$ is the identity element. Let $P_a$, $P_b$ be the permutation representations of a and b, respectively. Then $$P_aP_b = P_a + P_b - I_m \quad (6)$$

As a corollary, it can be readily proven that given a finite non-empty set of n, m×m permutation matrices $$\{P_t\}_{t=1}^{n}$$

in which each pair of elements $P_a$, $P_b$, fulfills the conditions of the lemma, then:

$$\prod_{t=1}^{n} P_t = \left(\sum_{t=1}^{n} P_t\right) - (n-1)\mathbb{I}_m \quad (7)$$

It should be noted that the (e.g., maximum) number of disjoint and thus commuting permutation matrices is n=[m/2]. Next, the latest result can be applied to a product of doubly stochastic matrices whose generating permutations fulfill the conditions of the lemma. For example, let $$\{P_t\}_{t=1}^{n},$$

be a non-empty set of m×m matrices such that each element is involutory and each pair commutes. Then the following identity holds for the composition of elementary double stochastic matrices generated by the $P_t$, $$\prod_{t=1}^{n}\left(\mathbb{I}_m + \sin^2(\theta_t)\left(P_t - \mathbb{I}_m\right)\right) = \mathbb{I}_m + \sum_{t=1}^{n}\sin^2(\theta_t)\left(P_t - \mathbb{I}_m\right) \quad (8)$$

Applying the results just obtained to the definition of layer of PSSWAPs, $$C(\Gamma_k, \theta) = \mathbb{I}_m^{\otimes 2} + \sum_{P_i\in\Gamma_k} \sin^2(\theta_i)\left(P_i^{\otimes 2} - \mathbb{I}_m^{\otimes 2}\right) \quad (9)$$

Assuming there are m qubits, then it can be shown that the repetition of patterns constructed as depicted in FIG. 4E, generates a set of permutations that contains a subgroup of the symmetric group $S_m$. Also, as one may expect, increasing the number of replica creates subgroups that approach in term of order, the group $S_m$. Accordingly, the construction favors the minimization of the resulting circuit depth.

The Optimization Problem: Example Numerical Method

In one embodiment, a heuristic is developed for the solution of the optimization problem:

$$\min_{\theta\in R^{ST}} card(\theta), \quad (10)$$
$$\text{s.t. } \mathcal{L}(\theta) = 0,$$

where card(θ) is the cardinality of the vector θ.

In some embodiments, solving for the optimization problem may use the Rolling Horizon (RH) technique. The RH technique consists of partitioning a decision problem into a sequence of sub-problems whose aggregated solutions constitute a solution for the whole problem. The sub-problems often are identified by time windows of fixed length. Using the RH technique strategy may help in obtaining a process referred to herein as "adaptive feasibility". The terminology finds the following motivation, where the process is referred to as "adaptive" because the RH depth adjusts to the best sub-problem where feasibility becomes reachable. Considering the structure of the hardware cost function, for all s, the variables $$\theta_s^\tau,$$

appear in the terms $\mathcal{L}_t$ of the hardware cost function:

$$\mathcal{L}(\theta)=\sum_{t=0}^{\tau-1}\mathcal{L}t(\theta), \tag{11}$$

with $$\mathcal{L}_t(\theta)=\beta(t)vec_r(M_c)^T K^{(t)} vec_r\left(G^{(t)}\right), \tag{12}$$

with $t \geq \tau$.

Since the permutation at time t influences the permutations of the subsequent circuit layers, then the feasibility of lower circuit layers (w.r.t. time t) is favored using the decreasing function β(t) introduced in equation (12) Now, it follows that the optimization problem takes the equivalent form:

$$\min_{\theta\in R^{ST}} \|\theta\|_2^2 \tag{13}$$

$$\text{s.t. } \mathcal{L}(\theta)=0,$$

which may be solved using a Differential Multiplier Method.

Lagrange multiplier λ, produces a sequence of updates for the variables θ and λ, so $$\theta \longleftarrow \theta-\eta_\theta\nabla_\theta\left(\|\theta\|_2^2\right)+\lambda\mathcal{L}(\theta), \tag{14}$$

$$\lambda \longleftarrow \lambda+\eta_\lambda\nabla_\lambda\left(\|\theta\|_2^2\right)+\lambda\mathcal{L}(\theta), \tag{15}$$

The above equations are applied until a stop condition is reached. In the equations above, $\eta_\theta$ and $\eta_\lambda$ represent the step sizes for the variables θ and λ, respectively. Since, $\mathcal{L}$ (θ)=0, the second update corresponds to a monotonic increase of λ, that is:

$$\lambda \longleftarrow \lambda+\eta_\lambda\mathcal{L}(\theta). \tag{16}$$

The latter equation can be used to prove that the optimizer gets attracted by the stationary points of L, where such points have a known and convenient structure.

In the embodiments that follow, two processes may be used to optimize the qubit circuit routing. One process uses a doubly stochastic matrices-based swap. The other process uses a global solver, for example, the Knitter algorithm, to solve the swap mapping problem. The Knitter algorithm can be interpreted as a global solver (w.r.t. the circuit) for the swap mapping problem. The input circuit may be split into sections using the rolling horizon technique so that the Knitter algorithm only acts upon each of the sub-circuits separately.

Knitter Algorithm

In one embodiment, the process uses the Knitter algorithm, where the input circuit is given as a sequence of graphs $G^{(t)}$ that is used alongside the hardware graph M to construct the hardware cost function $\mathcal{L}$. The construction depends on the machine topology. In one process loop, the vector θ is updated in a gradient descent fashion using the gradient of the function $$f(\theta)=\|\theta\|_2^2+\lambda\mathcal{L}(\theta).$$

Since the problem is non-convex, the iteration is executed for example, max trials≥1 times. At the end of each iteration, the projection $\square_{\Omega^{ST}}$ onto the set $\Omega^{ST'}$ is applied to the vector θ. After the trials are completed, the merit function $$g(\theta)=\|\theta\|_2^2+\alpha\mathcal{L}(\theta)$$

to choose the best solution. Here the parameter α>0 is a trade-off between swaps minimization and feasibility maximization. Once the solution (e.g., best solution) is realized, the number l of subsequent circuit layers may be counted, starting from the first, that fulfill the hardware constraints.

Example Doubly Stochastic Matrices Swap

In one embodiment, the doubly stochastic matrices-based SWAP process partitions the input circuit into sub-circuits upon which the Knitter algorithm is performed. The depth of the sub-circuits is given by a hyper-parameter horizon, however the starting point for the horizon advances adaptively depending on the feasibility reached by the previous iteration. In some embodiments, a programmed function takes a vector of angles θ to a sequence of permutations matrices. The elements of the vector θ are expected to belong to the set Ω, that is the angles represent a vertex of the Birkhoff polytope. But this is consistent with the value returned by function Knitter.

In addition, the permutations applied to circuit layer t, influence all the subsequent circuit layers from t+1 to T−1. Some embodiments may pre-permute the qubits of each block C with the permutations from the previous circuit layers. The result of the process includes a sequence of T×S involutory permutation matrices (either identity or SWAP type matrices).

Example Methodology

Figure 5:
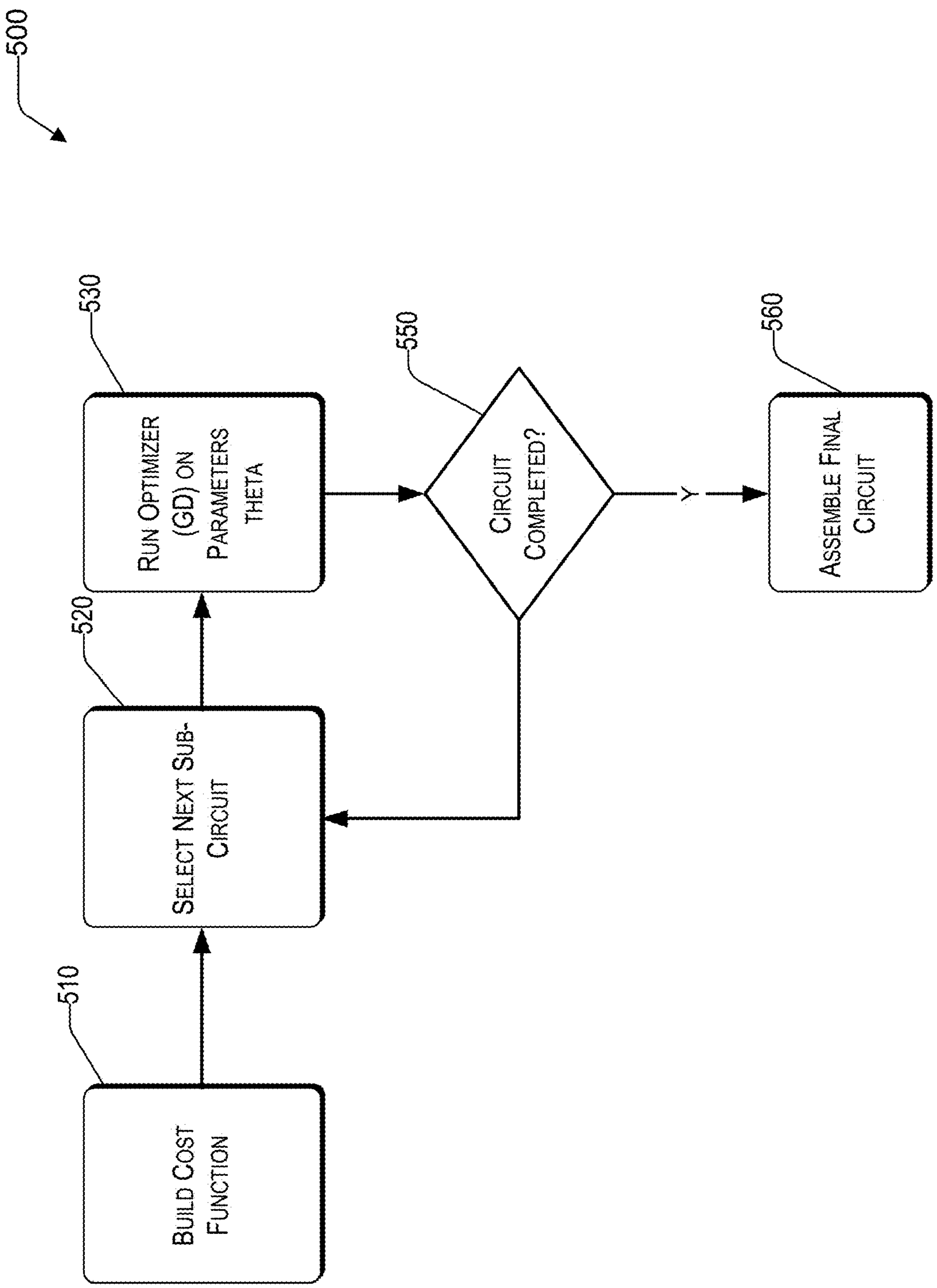
FIG. 5 is a flowchart of a method for building a qubit routing circuit according to some embodiments.

FIG. 5 shows a method 500 for building a qubit routing circuit for a quantum circuit according to an embodiment. The method 500 is generally a computer-implemented method whose actions may be performed by a computer processing unit, for example, the quantum processor 233, which may be resident in, for example, the quantum system 230 shown in FIG. 2A. As part of a software-based embodiment, the method 500 may be performed by a module (for example, the qubit routing engine 240 shown in FIG. 2A).

Generally speaking, an input circuit layer of qubits is received by the qubit routing engine 240 to analyze for the build cost of potential routing circuits that may be implemented from the input circuit layer. The qubit routing engine 240 may calculate 510 a cost function for building a proposed circuit layer. The cost function may be based on the number of permutations and depth of layers in the circuit being analyzed. Layers may be, for example, sub-circuits of the circuit being analyzed. A sub-circuit in the circuit being analyzed may be represented partitioning of the circuit into disjoint frames, going from the left to the right in a qubit circuit diagram, that once concatenated determine the original circuit. In one embodiment, the cost function may be determined from the convex combination of the number of violations of the constraints for the convex combination of routings (determined by the doubly stochastic matrices).

For a selected 520 circuit layer, being analyzed, the qubit routing engine 240 may run 530 an optimizer on parameters selected for the qubit circuit. For example, the optimizer may be executed on the cost function for a current circuit layer being analyzed. The optimizer may be run for each circuit layer of the overall circuit. Some embodiments may use a gradient descent method for optimizing a differentiable function that includes the parameters. The parameters theta are tuning parameters being optimized that determine the superposition of solutions; that is the doubly stochastic matrices. The optimizer minimizes the cost function for each of the circuit layers, based on output parameters (the thetas) determined from one or more previous circuit layers as the analysis proceeds through each circuit layer. Since circuit layers are not independent, the routing determined for layers before a current circuit layer being analyzed influence the output parameters for the current layer.

In some embodiments, the number of constraints violations determined by the doubly stochastic matrices may be used to determine the cost function of a permutation. The constraint violations may be determined using the adjacency matrix of the hardware connectivity and that of the current circuit layer. For example, the current layer may not use couplings that are not present in the hardware. The optimizer effectively tunes the superposition of solutions (the doubly stochastic matrices) toward the solution which minimizes the cost. Tuning the superposition of solutions may include for example, changing the mixture of permutations that form a doubly stochastic matrix. The construction and parametrization of the doubly stochastic matrices may determine the behavior for solutions when the optimizer tunes the parameters. After a sub-circuit is analyzed, the qubit routing engine 240 may determine 550 whether the analysis of sub-circuits for the qubit circuit is complete. If not, the method 500 may return to selecting 520 the next sub-circuit. If all sub-circuits have been analyzed, then the qubit routing engine 240 may assemble 560 a finalized quantum circuit topology. The quantum circuit may be performed on a quantum computer, using the final circuit topology.

Figure 6:
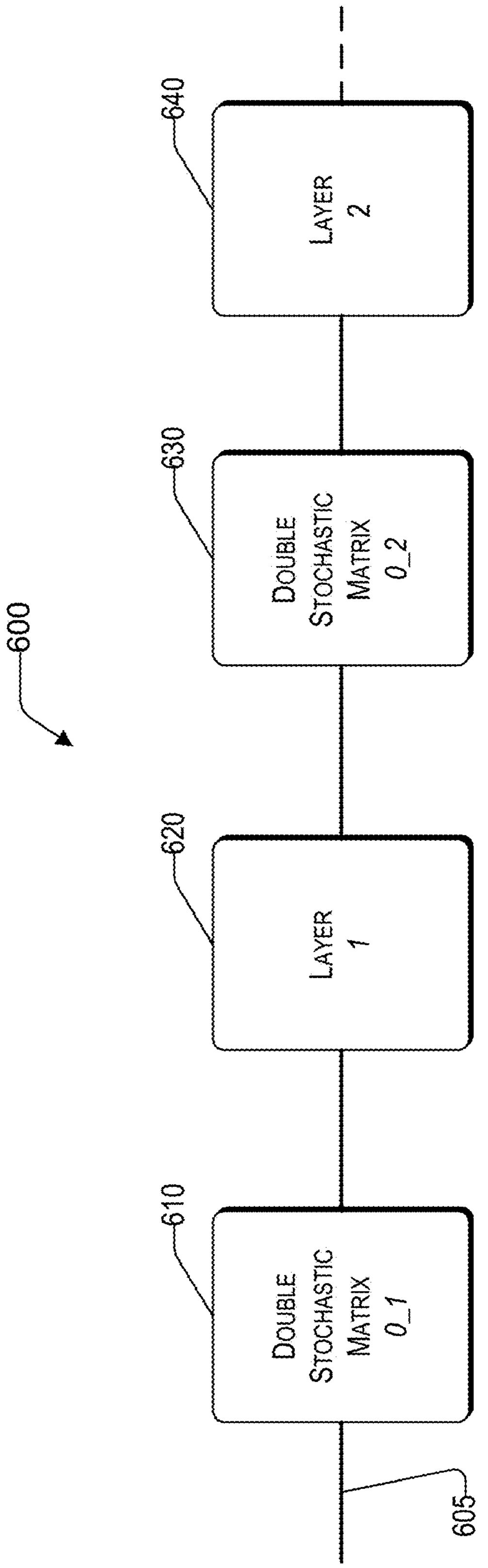
FIG. 6 is a block diagram of a qubit circuit according to some embodiments.
Figure 7:
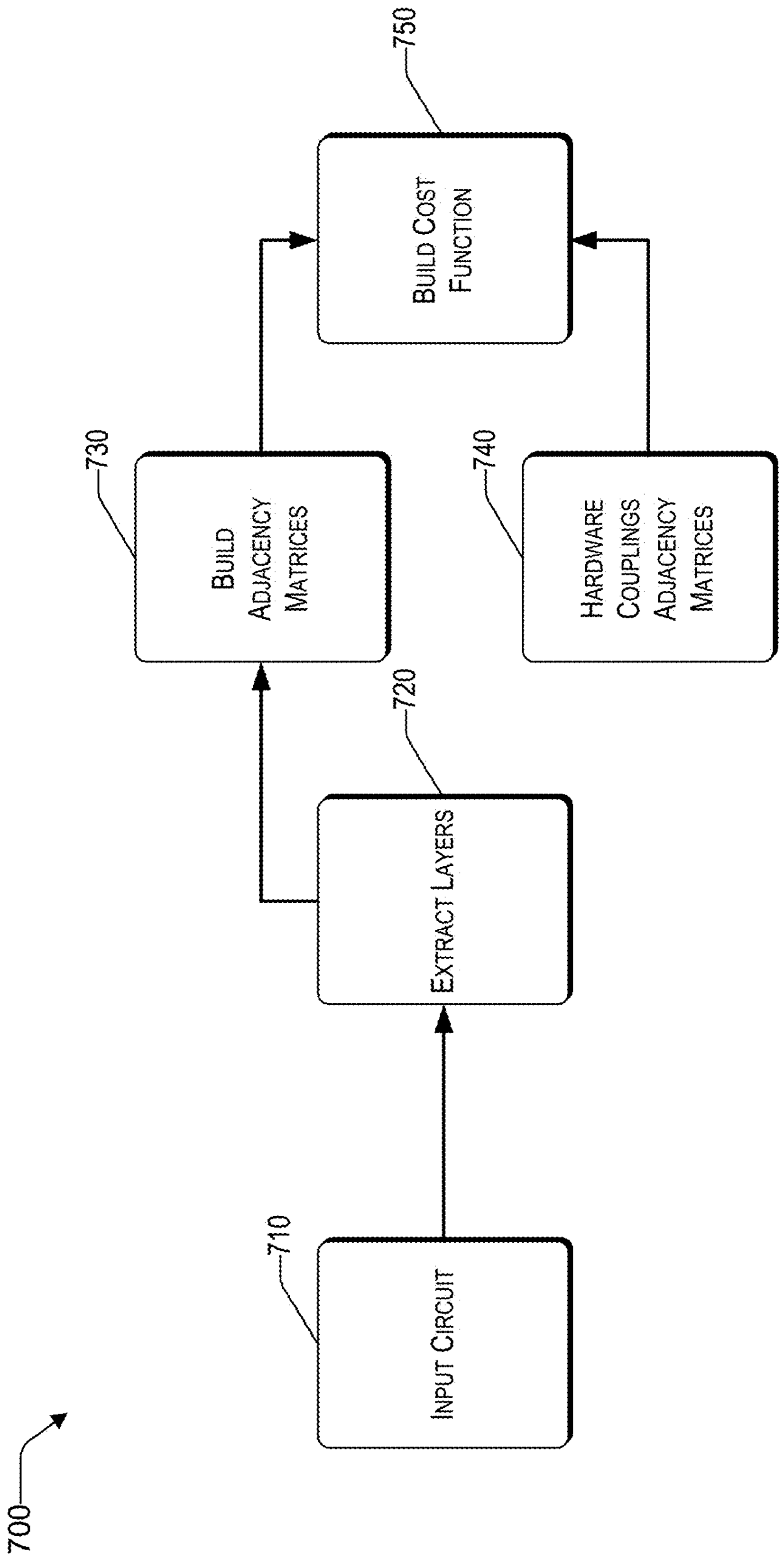
FIG. 7 is a flowchart of a method of determining build cost for a qubit circuit according to some embodiments.

FIG. 6 shows an example qubit circuit architecture 600 according to an embodiment. The architecture 600 represents the structure of a qubit circuit for determining a cost function according to an embodiment of the subject technology. The algorithm preparation module 221 (FIG. 2A) may generate code representing a parametric doubly stochastic matrix layer 610 of swap positions. The parametric doubly stochastic matrix layer 610 implements a linear composition of all possible configurations of the swaps possible for qubits in the first qubit circuit layer 620. A second parametric doubly stochastic matrix layer 630 may be generated using the input from the first qubit circuit layer 620. The output from the parametric doubly stochastic matrix layer 630 may be provided to a second qubit circuit layer 640, and so on where the structure for the circuit alternates between parametric doubly stochastic matrix layer and qubit circuit layers. FIG. 7 shows a method 700 of determining a cost function according to an embodiment. The qubit routing engine 240 may receive 710 a circuit input for build cost analysis. The qubit routing engine 240 may extract 720 layers of sub-circuits from the circuit under analysis. The qubit routing engine 240 may build 730 adjacency matrices with values representing the qubits and potential swap gates at different timesteps for the extracted sub-circuit layers. In an exemplary embodiment, the adjacency matrices may be double stochastic matrices. In some embodiments, the cost function may be determined for permutations of each of the extracted sub-circuit layers at discrete timesteps. In some embodiments, the qubit routing engine 240 may build 740 adjacency matrices for hardware couplings used in the qubit circuit. Using the adjacency matrices from the extracted layers and/or the hardware couplings, the qubit routing engine 240 may determine 750 the cost function associated with the circuit inputted for analysis.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to call flow illustrations and/or block diagrams of a method, apparatus (systems), and computer program products according to embodiments of the present disclosure. It will be understood that each step of the flowchart illustrations and/or block diagrams, and combinations of blocks in the call flow illustrations and/or block diagrams, can be implemented by computer readable program instructions.

These computer readable program instructions may be provided to a processor of a computer, special purpose computer, or other programmable data processing apparatus to produce a machine, such that the instructions, which execute via the processor of the computer or other programmable data processing apparatus, create means for implementing the functions/acts specified in the call flow process and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the call flow and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the call flow process and/or block diagram block or blocks.

The flowchart and block diagrams in the Figures illustrate the architecture, functionality, and operation of possible implementations of systems, methods, and computer program products according to various embodiments of the present disclosure. In this regard, each block in the call flow process or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or call flow illustration, and combinations of blocks in the block diagrams and/or call flow illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A computer program product for building a quantum circuit, the computer program product comprising:

one or more computer readable storage media, and program instructions collectively stored on the one or more computer readable storage media, the program instructions comprising:

receiving, by a computer processor, a plurality of qubits and an initial input circuit layer, including one or more of the plurality of qubits;

extracting layers of quantum sub-circuits from the initial input circuit layer;

building adjacency matrices for the layers of quantum sub-circuits;

determining a cost function for one or more of the extracted layers, based on one or more doubly stochastic matrices of values representing placements of swap gates in the quantum sub-circuits;

selecting a final quantum circuit topology based on the cost function for the one or more extracted layers; and performing the quantum circuit using the final quantum circuit topology, on a quantum computer.

2. The computer program product of claim 1, wherein the program instructions further comprise determining the cost function for permutations of each of the one or more extracted layers at discrete timesteps.

3. The computer program product of claim 1, wherein the doubly stochastic matrices represent a linear combination of permutations of each of the one or more extracted layers, at different timesteps for the extracted layers.

4. The computer program product of claim 1, wherein the cost function is based on minimizing a circuit depth of the final quantum circuit topology.

5. The computer program product of claim 1, wherein the program instructions further comprise building adjacency matrices for hardware couplings in the quantum sub-circuits.

6. The computer program product of claim 1, wherein the cost function is based on a number of constraints violations determined by the one or more doubly stochastic matrices.

7. The computer program product of claim 1, wherein the layers of quantum sub-circuits are commuting two-qubit gates.

8. A computer implemented method for building a quantum circuit, comprising:

receiving, by a computer processor operating a prediction engine, data from one or more software containers, wherein the data includes operations from one or more software applications in the software containers;

receiving, by the computer processor, a plurality of qubits and an initial input circuit layer, including one or more of the plurality of qubits;

extracting layers of quantum sub-circuits from the initial input circuit layer;

building adjacency matrices for the layers of quantum sub-circuits;

determining a cost function for one or more of the extracted layers, based on one or more doubly stochastic matrices of values representing placements of swap gates in the quantum sub-circuits; and selecting a final quantum circuit topology based on the cost function for the one or more extracted layers.

9. The method of claim 8, further comprising determining the cost function for permutations of each of the one or more extracted layers at discrete timesteps.

10. The method of claim 8, wherein the doubly stochastic matrices represent a linear combination of permutations of each of the one or more extracted layers, at different timesteps for the extracted layers.

11. The method of claim 8, wherein the cost function is based on minimizing a circuit depth of the final quantum circuit topology.

12. The method of claim 8, further comprising building adjacency matrices for hardware couplings in the quantum sub-circuits.

13. The method of claim 8, wherein the cost function is based on a number of constraints violations determined by the one or more doubly stochastic matrices.

14. The method of claim 8, wherein the layers of quantum sub-circuits are commuting two-qubit gates.

15. A computing device configured to build a quantum circuit, comprising:

a processor operating a qubit routing engine; and a memory coupled to the processor, the memory storing instructions to cause the processor to perform acts comprising:

receiving, by the processor, a plurality of qubits and an initial input circuit layer, including one or more of the plurality of qubits;

extracting layers of quantum sub-circuits from the initial input circuit layer;

building adjacency matrices for the layers of quantum sub-circuits;

determining a cost function for one or more of the extracted layers, based on one or more doubly stochastic matrices of values representing placements of swap gates in the quantum sub-circuits; and selecting a final quantum circuit topology based on the cost function for the one or more extracted layers.

16. The computing device of claim 15, wherein the instructions cause the processor to perform a further act comprising determining the cost function for permutations of each of the one or more extracted layers at discrete timesteps.

17. The computing device of claim 15, wherein the doubly stochastic matrices represent a linear combination of permutations of each of the one or more extracted layers, at different timesteps for the extracted layers.

18. The computing device of claim 15, wherein the cost function is based on minimizing a circuit depth of the final quantum circuit topology.

19. The computing device of claim 15, wherein the instructions cause the processor to perform a further act comprising building adjacency matrices for hardware couplings in the quantum sub-circuits.

20. The computing device of claim 15, wherein the cost function is based on a number of constraints violations determined by the one or more doubly stochastic matrices.

* * * * *